United States Patent [19]

Kinsman et al.

[11] Patent Number: 4,914,269
[45] Date of Patent: Apr. 3, 1990

[54] METHOD OF SEALING A CERAMIC LID ON A CERAMIC SEMICONDUCTOR PACKAGE WITH A HIGH-POWER LASER

[75] Inventors: Larry D. Kinsman; Steven H. Laney; Wade D. Jorgensen, all of Boise, Id.

[73] Assignee: Micron Technology, Inc., Boise, Id.

[21] Appl. No.: 384,029

[22] Filed: Jul. 24, 1989

[51] Int. Cl.⁴ .............................................. B23K 26/00
[52] U.S. Cl. ........................... 219/121.64; 219/121.76; 219/121.77; 219/121.78
[58] Field of Search ....................... 219/121.13, 121.14, 219/121.63, 121.64, 121.6, 121.85, 121.35, 121.77, 121.76, 121.78

[56] References Cited

U.S. PATENT DOCUMENTS

| | | | |
|---|---|---|---|
| 3,210,171 | 10/1965 | MacDonald | 219/121.64 X |
| 3,217,088 | 11/1965 | Steierman | 219/121.64 X |
| 3,517,159 | 6/1970 | Milochevitch | 219/121.63 |
| 4,521,668 | 6/1985 | Osial et al. | 219/121.64 |

Primary Examiner—C. L. Albritton
Attorney, Agent, or Firm—Angus C. Fox; Stan Protigal; Jon Busack

[57] ABSTRACT

A method of sealing a ceramic lid on a ceramic semiconductor package with a high-power laser beam. As an aid to package assembly prior to the fusion of the package lid to the package body, a lid recess is created around the die installation cavity of the package body. Following the installation of a die within a package cavity, the package body is retrieved from a process tray by a pick and place robot and placed in a position locating fixture. The same robot then retrieves a ceramic lid from an automatic lid dispensing unit, and places it within the lid recess of the package body. With the lid positioned within the recess, a Yttrium-Aluminum-Garnet (YAG) laser with beam splitter optics is moved by an X-Y table arm precisely over the top of the package. Moving with a linear speed of approximately 2.1 cm/sec. and with a power setting of approximately 170 watts, the split beam YAG laser simultaneously fuses a pair of opposite edges of the lid to the adjacent edges of the recess. A second pass with the split beam laser fuses the remaining pair of lid edges to the package body. Total process time for hermetically sealing the lid to the body is less than two seconds. Once the package is sealed, the robot retrieves the part and places it in an output queue.

14 Claims, 4 Drawing Sheets

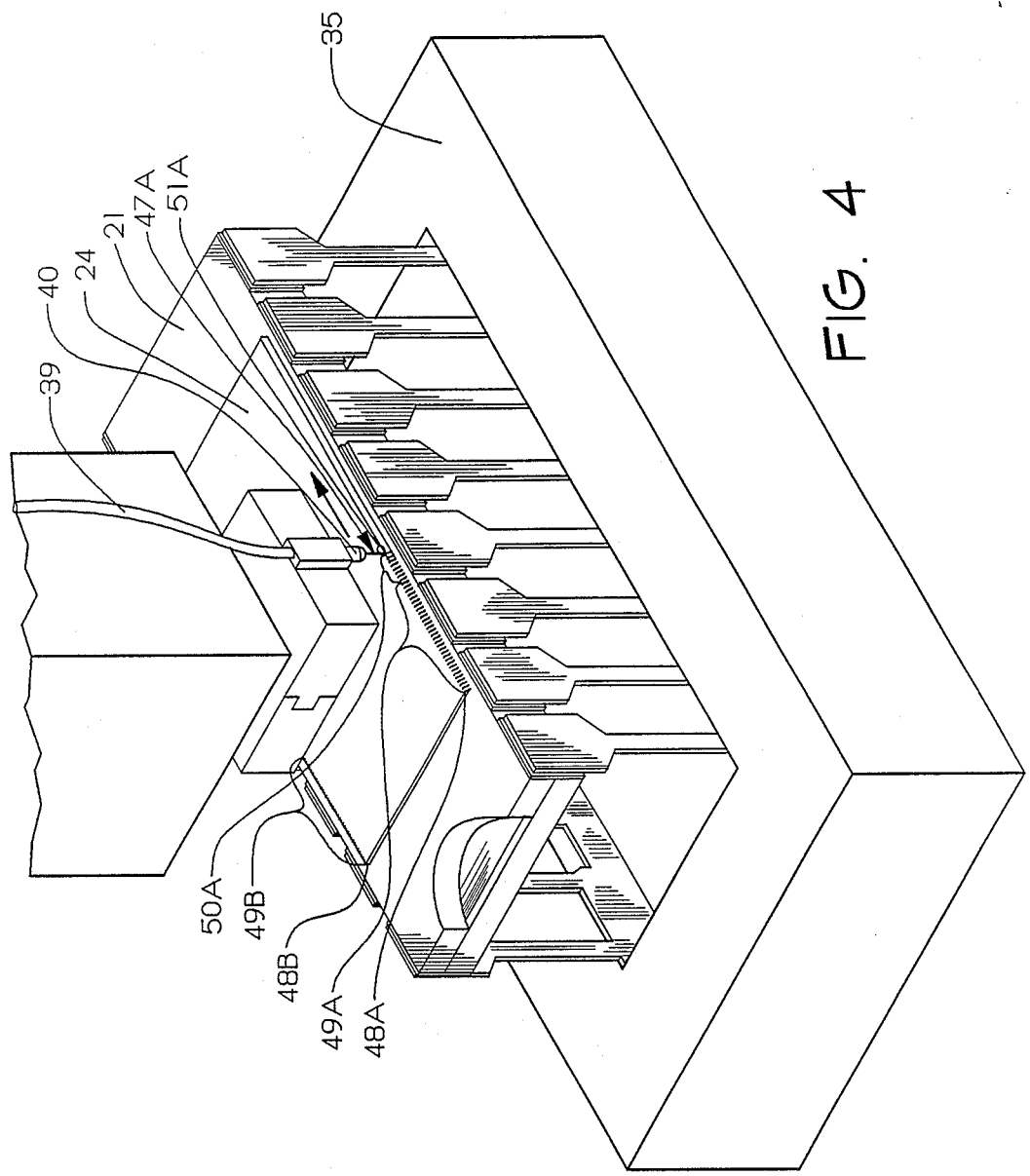

METHOD OF SEALING A CERAMIC LID ON A CERAMIC SEMICONDUCTOR PACKAGE WITH A HIGH-POWER LASER

FIELD OF THE INVENTION

This invention relates to semiconductor chip encapsulation techniques, and more specifically, to a method for hermetically sealing a ceramic semiconductor package by fusing the package lid to the package body with a high-power laser.

BACKGROUND OF THE INVENTION

Integrated semiconductor devices are typically constructed en masse on a wafer of silicon or gallium arsenide. Each device generally takes the form of an integrated circuit (IC) die. If the die is to be encapsulated in a plastic package, it is first bonded to the die-mounting paddle of a leadframe which is attached to other leadframes in a leadframe strip. The wire attachment pads on the die are connected with their corresponding leads on the leadframe with aluminum or gold wire during a wire bonding process, following which the die is coated with a protective polyimide film. Finally, the die is encapsulated in plastic and the plastic-encapsulated chip undergoes a trim and form operation which separates the interconnected packages on the leadframe strip into individual entities and bends (forms) the leads of each package. The package is then recognizable as an IC "chip". The operation for manufacturing plastic-encapsulated packages is highly automated, allowing high quality and low cost.

The encapsulation of dies in ceramic packages is a more complicated and, generally, much less automated process. FIG. 1 is an isometric view of a typical ceramic, side-brazed, dual inline package. Such a package, consisting of a main body 11 and a lid 12, is typically expensive, costing an average of $3.75 per 16-pin package. The lid 12, manufactured from a nickel-gold alloy, contributes approximately 20% to the cost of the package. The main body 11 is formed from three ceramic layers. The first layer 13, contains a gold-plated ground plane 14, which is connected to the grounded pin of the package. The second layer 15 contains numerous gold-plated traces 16 which serve as the package bonding pads and each of which is interconnected with its associated package pin. The third layer 17 has a gold-plated border 18 surrounding the die installation cavity 19. A semiconductor die will be bonded to the ground plane 14 within the die installation cavity, and the bonding pads of the die are interconnected with the bonding pads formed by the ends of traces 16 of the package body with gold wire during a wire-bonding operation.

Still referring to FIG. 1, the process of hermetically sealing the lid 12 to main body 11 proceeds by clamping the lid 12, which is coated with a solder border 20, in position over the die installation cavity, following which the entire package is subjected to a solder reflow operation. During reflow, which lasts some 25 minutes, the solder border 19 on the lid melts and fuses with the gold-plated border 18 on body 11. Each package must be individually retrieved from and returned to process trays, since the leads are not joined with those of other packages in a leadframe strip. In addition, each lid 12 must be individually clamped to its associated package body.

SUMMARY OF THE INVENTION

The method of hermetically sealing a ceramic lid on a ceramic semiconductor package with a high-power laser beam, which is the focus of the present invention, reduces ceramic package manufacturing unit cost, and greatly speeds the hermetic package sealing process. In addition, the necessity of clamping the lid to the package body during reflow may be eliminated with a minor change in package design.

The laser sealing process described herein dispenses with the gold-plated and solder borders on the body and lid, respectively. The only modification made to a standard ceramic package body (other than the elimination of the gold and solder sealing borders) is the creation of a lid recess around the die installation cavity on the package body. Following the installation of a die within a package cavity, the package body is retrieved from a process tray by a pick and place robot and placed in a position locating fixture. The same robot then retrieves a ceramic lid from an automatic lid dispensing unit, and places it within the lid recess of the package body. The upper surface of the lid is raised approximately 0.125 mm above the upper surface of the package body. With the lid positioned within the recess, a Yttrium-Aluminum-Garnet (YAG) laser with beam splitter optics is moved by an X-Y table arm precisely over the top of the package. Moving with a linear speed of approximately 2.1 cm/sec. and with a power setting of approximately 170 watts, the split beam YAG laser simultaneously fuses a pair of opposite edges of the lid to the adjacent edges of the recess. A second pass with the split beam laser fuses the remaining pair of lid edges to the package body. Total process time for hermetically sealing the lid to the body is less than two seconds. Once the package is sealed, the robot retrieves the part and places it in an output queue.

BRIEF DESCRIPTION OF THE DRAWINGS

FIG. 4 is a close-up isometric view of a ceramic package which is undergoing laser fusing of the lid to the body.

PREFERRED EMBODIMENT OF THE INVENTION

Figure 1:
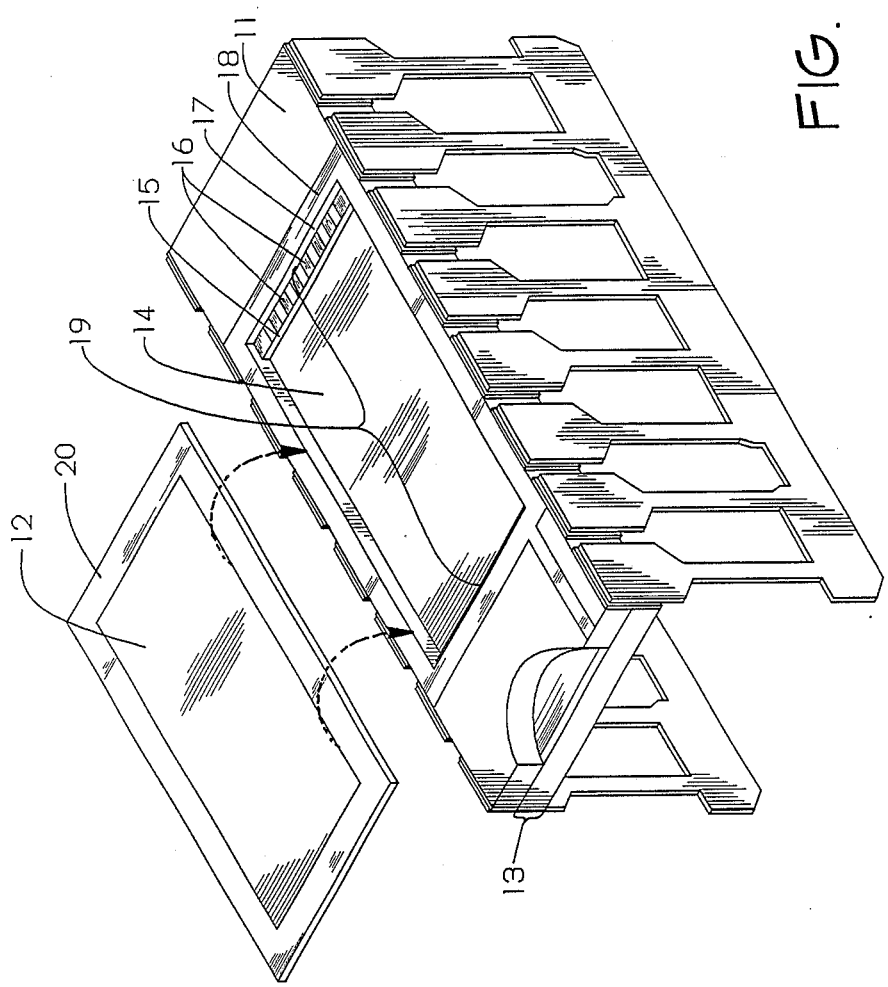
FIG. 1 is an isometric view of a standard ceramic package body and lid.
Figure 2:
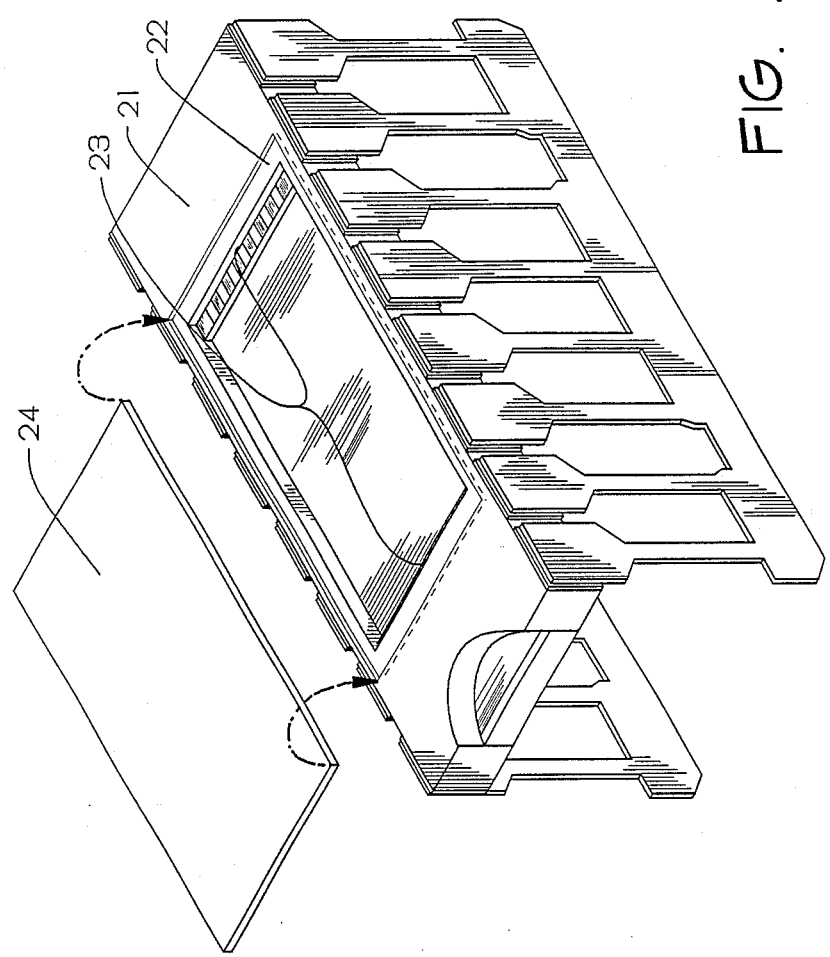
FIG. 2 is an isometric view of a ceramic package body and lid designed to be hermetically sealed with heat generated by a laser beam without the need for clamping the lid to the package body.

Referring now to FIG. 2, an improved ceramic package is shown that is optimized for hermetic sealing with a laser beam. The gold-plated and solder borders on the body and lid of the standard ceramic package of FIG. 1 are unnecessary. The improved package body 21 incorporates a lid recess 22 around the die installation cavity 23 on package body 21. The lid recess 22 is used to position the lid 24 on the body 21 during the laser fusion process.

Figure 3:
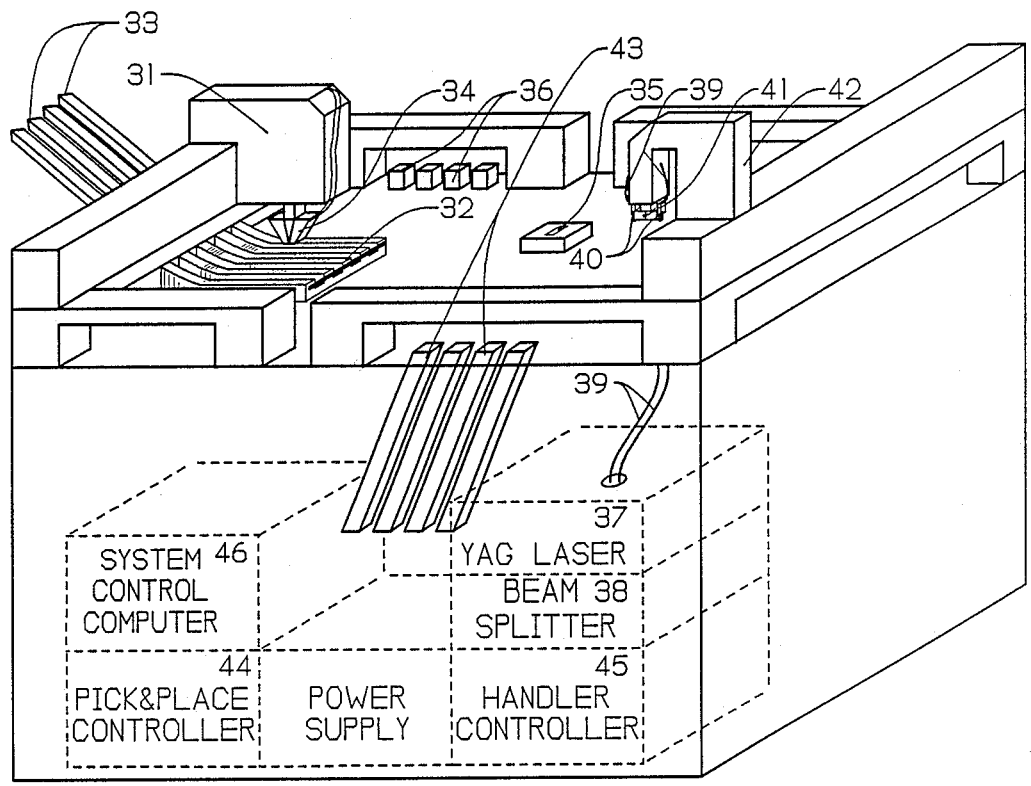
FIG. 3 is a mechanical schematic diagram of a robotic system set up for the laser sealing process.

Referring now to FIG. 3, a mechanical schematic of a ceramic package laser sealing device is shown. A pick-and-place apparatus 31, having X, Y, and Z axis movement capability fetches a ceramic package body with an installed die from the body pick-up station 32 at the end of one of the part feeder tubes 33 with partgrasping chuck 34, and places it within a part locating fixture 35. The pick-and-place apparatus 31 then retrieves a package lid from one of the lid feeder magazines 36 and places it within the lid recess of the package body that has been placed within part locating fixture 34. A Yttrium-Aluminum-Garnet laser 37 generates a 100 watt beam which is split by the optics of beam splitter 38. Each half of the split laser beam is fed through a fiber optic cable 39 to one of a pair of focusing lenses 40 mounted on opposite sides of a rotating effector head 41, which is, in turn, mounted on a head handler apparatus 42 having X, Y, and Z axis movement capability. The handler apparatus 42 positions effector head 41 over the package body and lid, both of which are located within part locating fixture 34, in such a position that when laser energy is fed to the focusing lenses 40, the beams impinge on a first pair of opposite sides of the lid along its perimeter. Both beams, each of which has a focused diameter of 0.28 mm and an energy of approximately 40 watts, are moved at a constant rate of approximately 13 mm per second, heating the ceramic material along the opposite edges of the lid, as well as immediately adjacent portions of the body. The material of the lid fuses with that of the body, and as the beams move along the lid perimeter, previously melted material solidifies, resulting in a hermetic seal along the area so heated. When fusing has been completed along the first pair of opposite sides, the handler rotates the beams, adjusts their separation, proceeds to seal the second pair of opposite sides of the lid to the body. The pick and place apparatus then retrieves the sealed package and loads it into a finished part placement receptacle 43. The entire operation takes two to three seconds.

Still referring to FIG. 3, the pick-and-place apparatus 31 is controlled by pick-and-place controller 44; the head handler apparatus 42 is controlled by handler controller 45. A system control computer 46 integrates the operation of both the pick-and-place apparatus 31 and the head handler apparatus 42 and provides movement control instructions.

Referring now to FIG. 4, a ceramic package located on part locating fixture 34 is shown undergoing fusion of lid 24 to body 21. The pair of laser beams 47A and 47B (47B is not visible in this view), are moving at a constant velocity in the direction of the bold arrow. The fusion welding of the lid 24 to body 21 began at one end of the lid at points 48A and 48B. Regions 49A and 49B have already been heated to the point where molten lid material has fused and solidified with molten body material. Regions 50A and 50B (50B is not shown) are still in a molten state and have not yet solidified, while regions 51A and 51B (51B is not shown) are being heated by laser beams 47A and 47B, respectively, and are approaching a molten state.

Although only the preferred embodiment of the invention has been described herein, it will be apparent to one skilled in the art that changes and modifications may be made thereto without departing from the spirit and scope of the invention as claimed.

We claim:

1. A method of sealing the die installation cavity of a ceramic semiconductor package body with a ceramic lid, comprising the following steps:
   positioning the lid such that it completely covers the die installation cavity; and
   simultaneously heating portions of the ceramic material around the perimeter of the lid and adjacent portions of the ceramic material of the package body with a beam of coherent light to a temperature sufficient to cause a fusing of the lid and body materials in the region so heated.

2. The method of claim 1, wherein the lid is fused around its entire perimeter to the package body.

3. The method of claim 2, wherein the beam of coherent light is moved along the lid perimeter at a constant velocity such that heating, liquification, fusing, and solidification of the lid and body ceramic material occurs in linear fashion.

4. The method of claim 2, wherein the beam of coherent light is optically split, such that the split portions of the beam can heat and fuse opposite-edge portions of the lid to the package body simultaneously.

5. The method of claim 3, wherein the coherent light beam is produced by a Yttrium-Aluminum-Garnet laser.

6. The method of claim 4, wherein the heating energy applied at any given point along the lid perimeter by a split portion of the beam is within a range of 50 to 75 watts/mm$^2$/sec.

7. The method of claim 5, wherein positioning the lid is accomplished by inserting the lid in a lid recess which is formed in the package body around the die installation cavity.

8. The method of claim 6, wherein the upper surface of the lid, when inserted within the lid recess, extends above the upper surface of the package body.

9. A method of sealing the die installation cavity of a ceramic semiconductor package body with a ceramic lid, comprising the following steps:
   positioning the lid such that it completely covers the die installation cavity; and
   directing the focus of a pair of coherent light beams to points on opposite edges on the perimeter of the lid;
   activating said pair of light beams in order to cause the heating past the melting point of the ceramic materials comprising the lid edges and adjacent body portions;
   simultaneously moving the focal point of both beams along said opposite edges, thus allowing edge and adjacent body portions already heated past the melting point to cool and fuse, while heating additional portions of the edges and adjacent body portions past their melting points; and
   continuing the movement of both beams until the entire perimeter of the lid is fused to the package body.

10. The process of claim 8, wherein said pair of light beams are generated by the optical splitting of a single beam.

11. The process of claim 9, wherein said single beam is generated by a Yttrium-Aluminum-Garnet laser.

12. The process of claim 10, wherein the heating energy applied at any given point along the lid perimeter by a split portion of the single beam is within a range of 50 to 75 watts/mm$^2$/sec.

13. The method of claim 11, wherein positioning the lid is accomplished by inserting the lid in a lid recess which is formed in the package body around the die installation cavity.

14. The method of claim 12, wherein the upper surface of the lid, when inserted within the lid recess, extends above the upper surface of the package body.

* * * * *